US008051346B2

(12) United States Patent
Somasundaram et al.

(10) Patent No.: US 8,051,346 B2
(45) Date of Patent: Nov. 1, 2011

(54) FAULT INJECTION

(75) Inventors: Senthil Somasundaram, Sunnyvale, CA (US); Jun Qian, San Jose, CA (US); Paul Chang, San Jose, CA (US); Thomas A. Hamilton, Milpitas, CA (US)

(73) Assignee: Cisco Technology, Inc., San Jose, CA (US)

( * ) Notice: Subject to any disclaimer, the term of this patent is extended or adjusted under 35 U.S.C. 154(b) by 271 days.

(21) Appl. No.: 12/392,468

(22) Filed: Feb. 25, 2009

(65) Prior Publication Data

US 2010/0218058 A1 Aug. 26, 2010

(51) Int. Cl.
*G01R 31/28* (2006.01)
*G01R 31/08* (2006.01)
*G01R 27/28* (2006.01)
*G01R 31/00* (2006.01)
*G01R 31/14* (2006.01)
*G11C 7/00* (2006.01)
*G11C 29/00* (2006.01)

(52) U.S. Cl. ........ 714/724; 365/201; 324/512; 702/117; 702/118; 702/120

(58) Field of Classification Search .................. None
See application file for complete search history.

(56) References Cited

U.S. PATENT DOCUMENTS

| 4,875,209 | A | * | 10/1989 | Mathewes et al. | 714/703 |
| 5,561,762 | A | * | 10/1996 | Smith et al. | 714/33 |
| 6,536,008 | B1 | * | 3/2003 | Nadeau-Dostie et al. | 714/726 |
| 6,886,116 | B1 | * | 4/2005 | MacLellan et al. | 714/703 |
| 7,191,265 | B1 | | 3/2007 | De Angeli et al. | |
| 2005/0050393 | A1 | * | 3/2005 | Chakraborty et al. | 714/30 |
| 2006/0271825 | A1 | * | 11/2006 | Keaffaber et al. | 714/38 |
| 2008/0155328 | A1 | * | 6/2008 | Chakraborty | 714/32 |

* cited by examiner

*Primary Examiner* — Jeffrey A Gaffin
*Assistant Examiner* — Guerrier Merant
(74) *Attorney, Agent, or Firm* — Patterson & Sheridan, LLP

(57) ABSTRACT

Systems, methods, and other embodiments associated with programmable application specific integrated circuit (ASIC) fault injection are described. One example ASIC includes a serializer de-serializer (SERDES). The example ASIC may also include logics to process data in the ASIC. At least one of the logics either receives data from the SERDES and/or provides data to the SERDES. The example ASIC may also include an embedded fault injection logic (EFIL) to control injection of a fault to a path (e.g., data, control) associated with at least one of the logics. The example ASIC may also include an embedded set of multiplexers (ESOMs) controlled by the EFIL. The ESOMs are controllable by the EFIL to inject a fault signal to the data path.

20 Claims, 8 Drawing Sheets

FAULT INJECTION

BACKGROUND

An application specific integrated circuit (ASIC) is an integrated circuit that has been customized for a particular use. That particular use may be a complex process that needs to be tested. Conventionally, testing the complex process may have been difficult. An ASIC may be, for example, an integrated circuit designed solely to run in a network switch, network router, or other networking device. In these applications, and others, the ASIC may include diagnostic software designed to detect errors in data streams provided to and/or processed by the ASIC. Conventionally it has been difficult, if possible at all, to determine whether the diagnostic software is operating correctly. And yet, unless the diagnostic software can be tested, the diagnostic role of the network device may be unverified.

ASICs may be tested either in software or as hardware. Typical software simulations of ASICs may include hardware description language (HDL) based simulations where the ASIC itself exists only in software. This testing solution does not test an actual physical device. Typical hardware simulations require a protocol analyzer to be attached to the ASIC data lines to inject or force data faults. The protocol analyzer may also read the results of the data faults. However, this may be difficult when the ASIC being tested is embedded in a circuit board or integrated in a chip. While techniques may exist to determine whether the ASIC hardware is operating properly, conventionally it has been difficult, if possible at all, to determine whether diagnostic processes embedded on the ASIC are operating properly.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

BRIEF OVERVIEW

Figure 1:
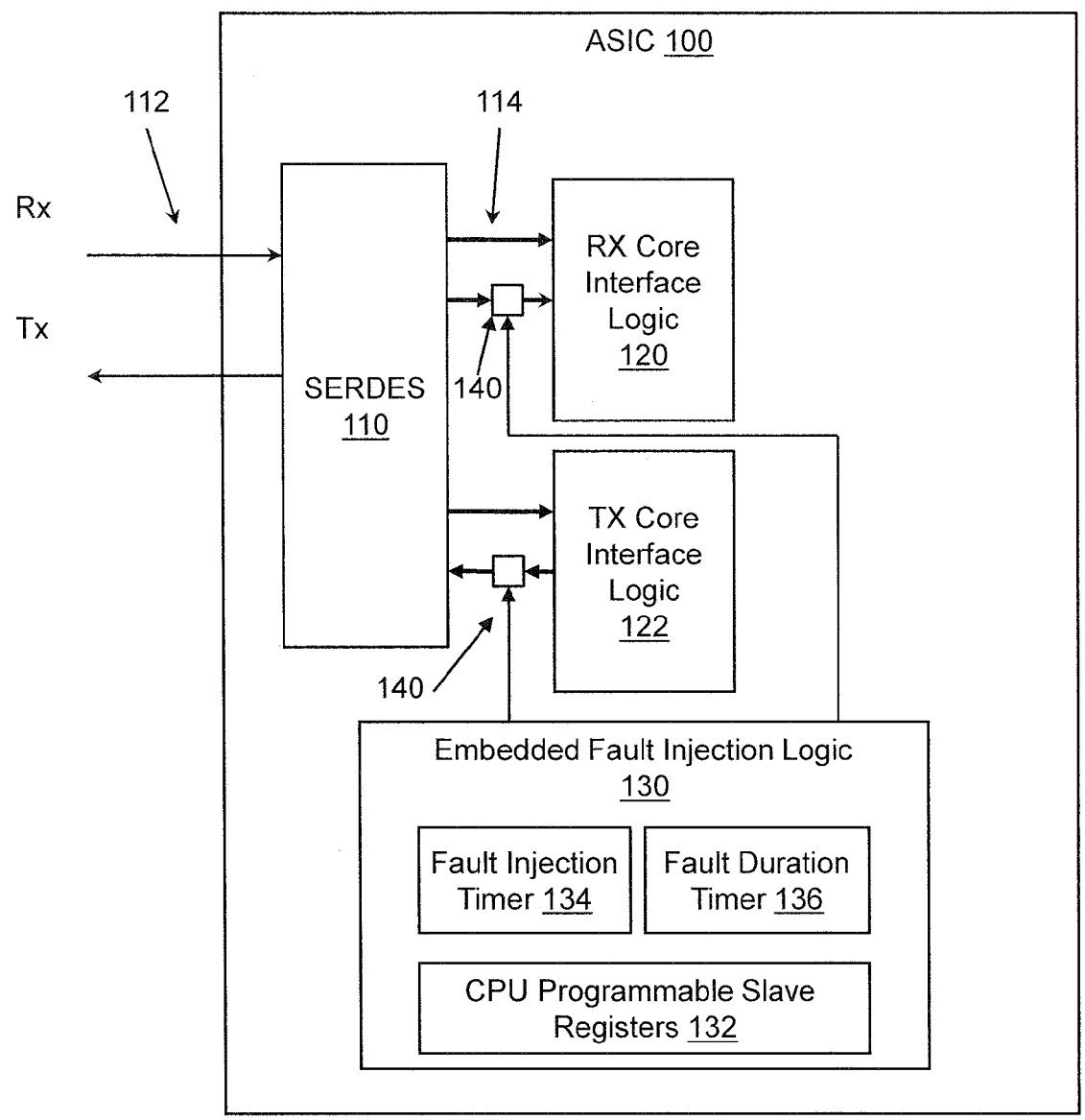
FIG. 1 illustrates an example ASIC associated with programmable fault injection.

ASIC testing is often performed by simulating intermittent failures in data processed by the ASICs. This type of testing may also be employed to test diagnostic software running on an ASIC. Testing may check ASIC diagnostic software/hardware including, for example, error detection systems, error handling systems, and rebooting systems. Intermittent failures may include data inversions that, for example, flip a bit of data from a one to a zero. Intermittent failures have conventionally been simulated by attaching external probes to make contact with a printed circuit board to inject data faults into the data stream. However, this approach has several issues including, for example, limited physical accessibility.

The availability of space on modern ASICs allows for simulating intermittent failures by an embedded data fault injection logic and internal fault injection circuitry. This internal fault injection circuitry can be programmatically controlled to facilitate exercising processes running on the ASIC. For example, an ASIC may include a diagnostic process to determine whether a line connecting two logics is operating correctly. Conventionally, signals on that line may have been controlled by an external probe. For example, a constant one, a constant zero, an inverted signal, and so on, may have been forced onto the line. Forcing these types of errors facilitated determining whether a process configured to detect this type of error was operating properly. Example systems and methods facilitate not just forcing one error on one line, but facilitate placing multiple errors of multiple types on multiple lines at multiple locations in an ASIC. This in turn facilitates exercising diagnostic software in the ASIC.

Due to the simplicity of programming an ASIC with standard functional blocks, embedded fault injection may be included in an ASIC. Standard functional blocks with known electrical characteristics (e.g. propagation delay, capacitance, inductance) may be used in multiple circuits. Standardized cell design in an ASIC includes using these standard functional blocks that may be transferred to newly designed ASICs. This type of cell design may achieve a high gate density and good electrical performance while minimizing design time.

A fault may be intentionally injected to test system error diagnosis software during a system software run, during ASIC bring-up, and at other times. Error diagnosis software may be designed to report whether a fault was detected, the type of fault that was detected, how the fault is to be handled, and so on. However, to be sure that the error diagnosis software is running properly, it needs to be exercised. Therefore, embedded fault injection logic in the ASIC facilitates real time system programmability that allows the fault test to be programmed by a processor external to the ASIC. This external program may specify the type of fault, the duration of the fault, the start time of the fault, the location of the fault in the ASIC, and so on. Using an embedded fault injector in place of using a protocol analyzer does not require the connection of probes to individual data lines in the ASIC. Furthermore, the embedded fault injector allows multiple fault injection locations between different logics within the ASIC to be tested simultaneously. The fault and the location of the fault may be determined by an embedded fault injection logic (EFIL), while the fault may be injected by multiplexers that are controlled by the EFIL.

Fault injection may be performed in an ASIC that includes logics that process data in the ASIC. An EFIL that is embedded in the ASIC may control injection of a fault to a data path associated with at least one of the logics. Additionally, an embedded set of multiplexers (ESOMs) may be controlled by the EFIL to inject a fault signal to the data path. Fault injection may force the input or output data, for a specified period of time, to values including stuck at one, stuck at zero, inverted, and so on.

Fault injection facilitates performing system software diagnosis and defect isolation. Fault injection facilitates injecting errors into an ASIC during diagnostic and system software testing. These errors facilitate triggering error detection logic, error handling logic, error correction logic, diagnostic logic, and so on, in the ASIC. Example fault injection systems may be programmable with respect to several properties. For example, fault injection may be programmed to occur at a specific location (e.g., data path, control path, ASIC boundary, I/O pin), at a specific time (e.g., after N clock cycles), for a specific duration (e.g., M clock cycles). Additionally, the type of fault to be injected may be programmed. For example, faults including stuck at one, stuck at zero, and inversion may be programmed. Thus, programmatic control of what type of fault is to be invoked at what location(s) and at what time and for what duration is available. This programmatic control facilitates exercising the functionality of processes on an ASIC. For example, the programmatic control facilitates producing the types of errors that diagnostic software on the ASIC is supposed to detect, handle, and/or correct.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

FIG. 1 illustrates an application specific integrated circuit (ASIC) 100. ASIC 100 includes a serializer de-serializer (SERDES) 110. A SERDES 110 may convert serial data coming into the ASIC 100 into parallel data. For example, data may come into the SERDES 110 on serial bus 112 as a stream of ones and zeros one after the other. The SERDES 110 may convert the data and place it onto a parallel bus 114 that outputs 8 bits at a time. The parallel bus 114 is illustrated having, for example, a receive clock (Rx Clk) and 8 parallel data lines to ASIC logic 420 of FIG. 4. The SERDES 110 may also provide a clocking signal and error detection information in the form of, for example, a checksum.

ASIC 100 may also include a set of logics 120 and 122 to process data in the ASIC 100. One skilled in the art may recognize that the logics 120 and 122 may be referred to as ASIC logics or embedded ASIC logics. The logics 120 and 122 may include a core logic or core ASIC logic that performs a large part of the processing in the ASIC 100. For example, an incoming data stream to a router may be matched by an ASIC logic to a single network connection attached to the router that requested the data of the data stream. At least one of the logics 120 and 122 may receive data from the SERDES 110 and/or provide data to the SERDES 110.

ASIC 100 may also include an embedded fault injection logic (EFIL) 130. The EFIL 130 may control injecting a fault to a data path associated with at least one of the logics 120 and 122. In one embodiment, the EFIL 130 may include a central processing unit (CPU) programmable slave register(s) 132. The CPU programmable slave register(s) 132 may be a data store that stores data electronically. The CPU programmable slave register 132 may control the fault state. In one embodiment, the EFIL 130 includes a fault injection timer 134 to control when to inject the fault signal. The fault injection timer 134 may start a clock that counts the number of ASIC clock cycles when the ASIC 100 starts executing a program to be tested for fault diagnosis. The fault injection timer 134 may include a data register that is associated with a number of ASIC clock cycles to count. The data register of the fault injection timer 134 may be, for example, a register in the CPU programmable slave registers 132. When the number of ASIC clock cycles to count is reached, the fault injection timer 134 may signal the EFIL 130 that it is time to inject a fault into the data path.

A user may program the CPU programmable slave registers 132 to inject user selectable faults into data streams in the ASIC 100. "User", as used herein, includes but is not limited to one or more persons, software, computers or other devices, or combinations of these.

In one embodiment, the EFIL 130 includes a fault injection timer 134 to control when the ESOMs 140 are to inject the fault signal. In one embodiment, the fault injection timer 134 includes a global start timer to control starting injection of the fault signal. In one embodiment, the fault injection timer 134 includes a transmit fault injection run timer to control starting injection of the fault signal to data transmitted from the SERDES 110. In one embodiment, the fault injection timer 134 includes a receive fault injection run timer to control starting injection of the fault signal to data transmitted to the SERDES 110. While transmission to and from the SERDES 110 is described, one skilled in the art will appreciate that the fault injection timer 134 may control injection of faults at other locations in the ASIC 100.

In one embodiment, the fault injection timer 134 includes a transmit fault injection run timer and a receive fault injection run timer. The transmit fault injection run timer controls starting injection of the fault signal to data transmitted from the SERDES 110. The receive fault injection run timer controls starting injection of the fault signal to a data transmitted to the SERDES 110. In one embodiment, the fault injection timer 134 is to control the duration of a fault state of the fault that is to be injected. The duration of the fault state may be controlled by a fault duration timer 136 that is external to the fault injection timer 134.

ASIC 100 may also include an embedded set of multiplexers (ESOMs) 140. The ESOMs 140 may be controlled by the EFIL 130. The ESOMs 140 may be controllable by the EFIL 130 to inject a fault signal to the data path. The ESOMs 140 are devices that select one of multiple input signals and output the selected signal as an output. Multiplexers allow several signals to share a device and/or allow the selection of several inputs from a set of inputs. The ESOMs 140 may have several inputs including, for example, a data input signal, an inverted data input signal (e.g. flip data input signal), a stuck at one fault, a stuck at zero fault, and so on. The EFIL 130 may control the ESOMs 140 to select from one of the above fault states.

In one embodiment, the EFIL 130 controls the ESOMs 140 to inject the fault signal to a single bit of the data path and/or to inject the fault signal to multiple bits of the data path. The ESOMs 140 may be, for example, the set of multiplexers 500 of FIG. 5. In one embodiment, the EFIL 130 controls the ESOMs 140 with a two bit signal that selects a fault state of the fault signal. A first state may be a stuck at zero fault, a second state may be a stuck at one fault, a third state may be an invert data fault, and a fourth state may be a normal data state.

In one embodiment, the ASIC 100 includes two or more logics. Since there are two or more logics, the ESOMs 140 may be placed between at least two different logics in the ASIC 100. The EFIL 130 controls the location of the fault to be injected. The ESOMs 140 may be placed in multiple locations, for example, between the serializer de-serializer (SERDES) 110 and the logic 120 and/or between logic 120 and logic 122. In one embodiment, the EFIL 130 controls the ESOMs 140 to inject faults at multiple locations within the ASIC 100 during the same time interval.

With the fault injection available, processes on ASIC 100 may be tested. For example, error detection, error handling, and/or error correction processes may be tested. The fault injection logics facilitate programming what type of fault is to be injected into the ASIC. The fault injection logics also facilitate programming where the fault is to be injected, when the fault is to be injected, and for how long the fault is to be injected. By way of illustration, an ASIC may be brought up. It may be desired to inject a stuck at zero error on a specific data line 10,000 clock cycles after bring up. It may be desired to have the stuck at zero error persist for 1,000 clock cycles and then turn into a stuck at one error. The fault injection logics illustrated in FIG. 1 facilitate programming the type, time, and nature of errors that are injected into the ASIC. This stuck at zero then stuck at one condition may be a condition to which error checking software in the ASIC is supposed to be able to detect and respond. Therefore, having this type of programmatic control facilitates exercising the error checking software and determining whether it detects the error and then handles the error.

Figure 2:
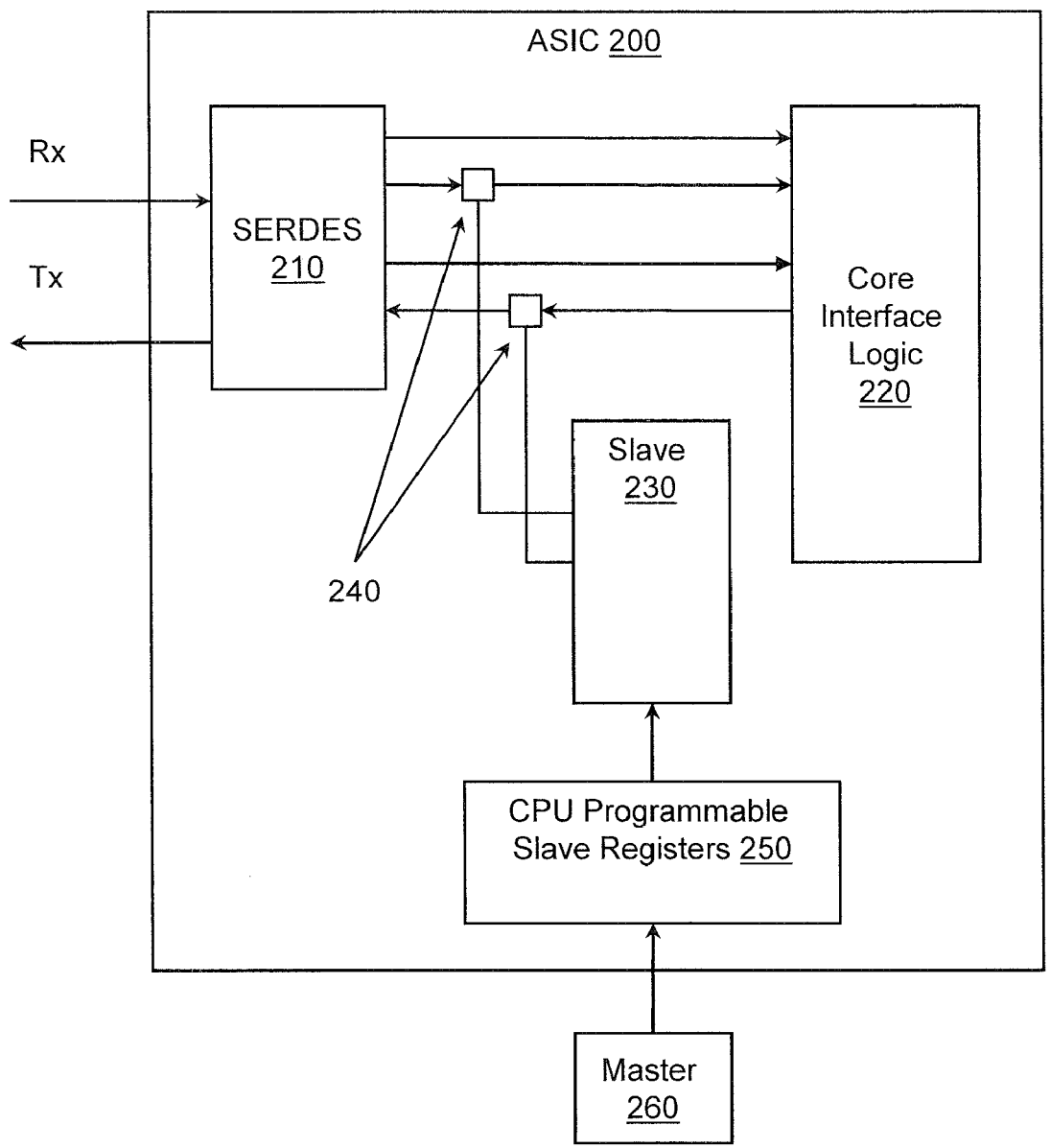
FIG. 2 illustrates an example ASIC associated with programmable fault injection.

FIG. 2 illustrates an example ASIC 200 associated with programmable fault injection. The ASIC 200 may include an embedded set of multiplexers (ESOMs) 240 that may be similar to ESOMs 140 of FIG. 1. The ESOMs 240 may be placed in multiple locations including, for example, between a data line transmitting from a SERDES 210 to a core interface logic 220, between a data line transmitting from the core interface logic 220 to the SERDES 210, and so on. A slave 230 may control the ESOMs 240 to inject data faults into a data stream(s) between the SERDES 210 and the core interface logic 220. The slave 230 may be connected to the ESOMs 240 by an operable connection that passes data electronically to the ESOMs 240 to control them to perform an action or sequence of actions. An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

The slave 230 may be controlled by central processing unit (CPU) programmable slave registers 250. The CPU programmable slave registers 250 may hold a testing program that is associated with a fault injection test. The registers 250 may include data associated with a fault type, a fault start time, a fault duration, a fault location, and so on. The CPU programmable slave registers 250 may be programmed by a master 260. The master 260 may be a computer with an interfacing cable or other computer communication capability that programs the registers of the CPU programmable slave registers 250.

Figure 3:
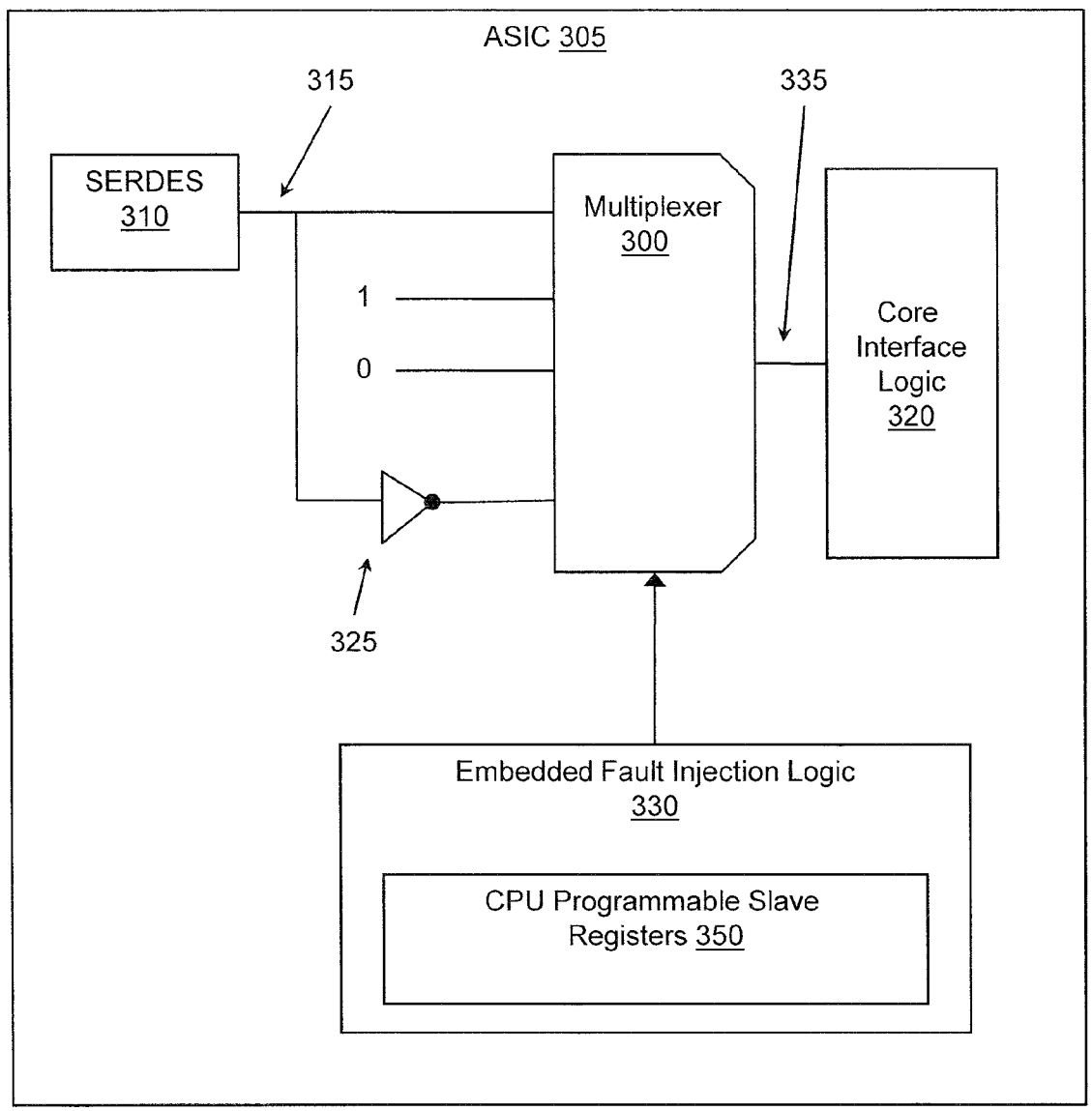
FIG. 3 illustrates an example multiplexer associated with programmable fault injection.

FIG. 3 illustrates an example multiplexer 300 associated with programmable fault injection. The multiplexer 300 may be, for example, one of the ESOMs 140 from FIG. 1. The multiplexer 300 may intercept an input data path 315 of a signal from a SERDES 310 that travels to a core interface logic 320. The SERDES 310 may be similar to the SERDES 110 of FIG. 1 and/or the SERDES 210 of FIG. 2. The core interface logic 320 may be similar to the core interface logic 220 of FIG. 2.

The input data path 315 from the SERDES 310 may be split into multiple paths. For example, one data path may go through an inverter 325 before going to the multiplexer 300, while another data path may go directly to the multiplexer 300. The data path that goes through the inverter 325 may allow the multiplexer 300 to provide a flip or invert fault signal to the output data path 335 to the core interface logic 320. Other inputs to the multiplexer 300 may include a one and/or a zero. The one input may allow the multiplexer 300 to provide a stuck on one fault signal to the core interface logic 320. The zero input may allow the multiplexer 300 to provide a stuck on zero fault signal to the core interface logic 320.

An embedded fault injection logic (EFIL) 330 may control the multiplexer 300 to output a fault signal. The EFIL 330 may be similar to the EFIL 130 of FIG. 1. The EFIL 330 may control the multiplexer with a two bit signal that selects a fault state of the fault signal to the core interface logic 320. The first state may be a stuck at zero fault, the second state may be a stuck at one fault, the third state may be an invert data fault, and the fourth state may be a normal data state. The EFIL 330 may include CPU programmable slave registers 350. CPU programmable slave registers 350 may be similar to CPU programmable slave registers 250 of FIG. 2. One skilled in the art will realize that CPU programmable slave registers 350 may be internal or external to the EFIL 330. One skilled in the art will realize that the multiplexer 300, the SERDES 310, the core interface logic 320, the EFIL 330, the CPU programmable slave registers 350, the inverter 325, and so on may all be embedded in an ASIC 305.

Figure 4:
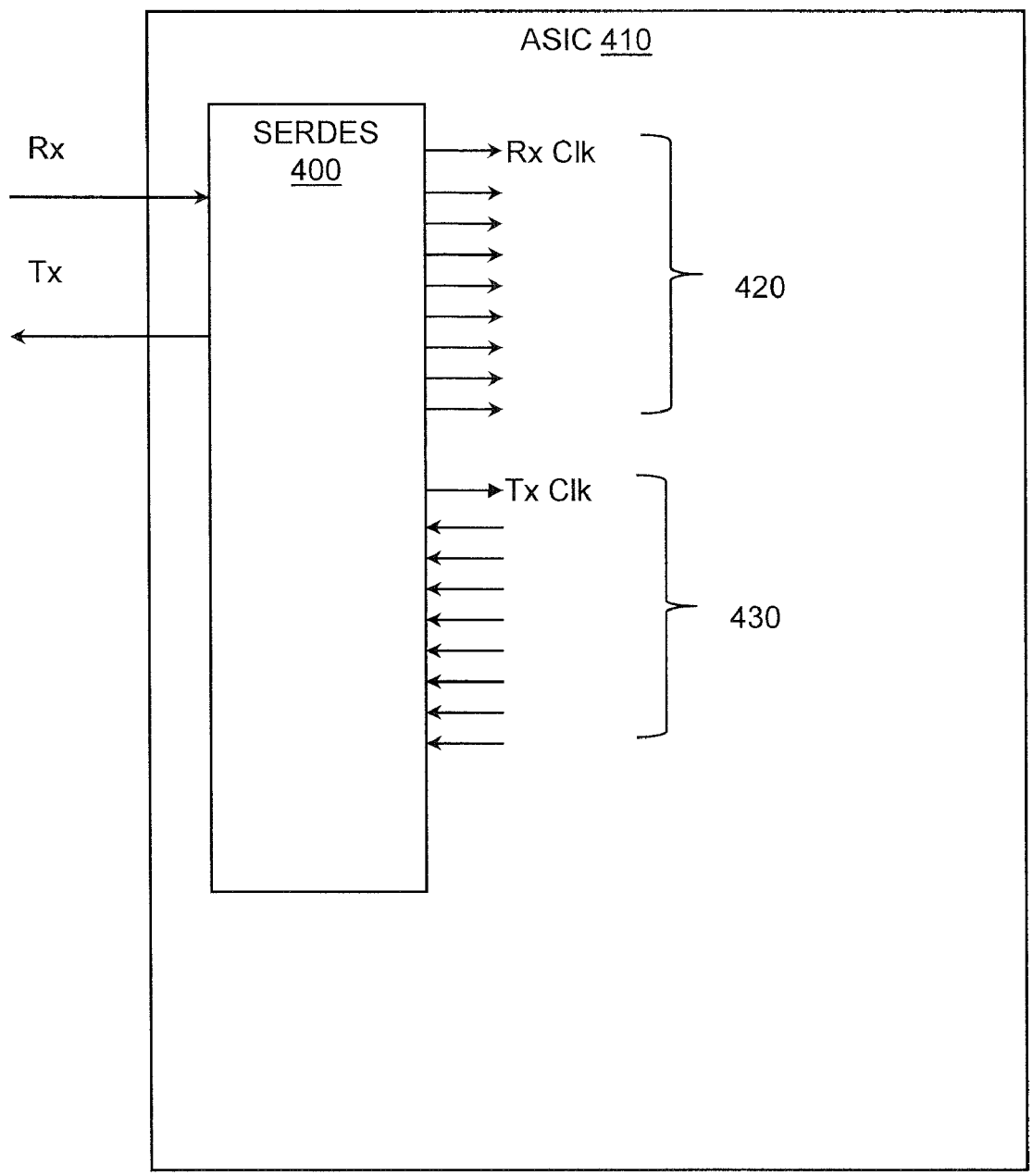
FIG. 4 illustrates an example serializer de-serializer (SERDES) associated with programmable fault injection.

FIG. 4 illustrates an example SERDES 400 associated with programmable fault injection. The SERDES 400 may be embedded in an ASIC 410. The SERDES 400 may be similar to the SERDES 110 of FIG. 1, the SERDES 210 of FIG. 2, and/or the SERDES 310 of FIG. 3. The SERDES 400 may convert data between serial data and parallel data in high speed communications. The SERDES 400 may use a shift register to receive the parallel data once per parallel clock cycle. The parallel data may be shifted out at the higher serial clock rate. A common coding scheme used with a SERDES is 8B/10B encoding. The typical 8B/10B SERDES parallel side interface has eight data lines, a clock line, and a control line. The SERDES 400 may include a receive clock (Rx Clk) and 8 bit parallel data to ASIC logic 420 that transmits data to an ASIC logic. The SERDES 400 may include a transmit clock (Tx Clk) and 8 bit parallel data from ASIC logic 430 that receives data from an ASIC logic. As described above, different faults may be injected singly and/or in sets on the various data and control paths connected to SERDES 400.

Figure 5:
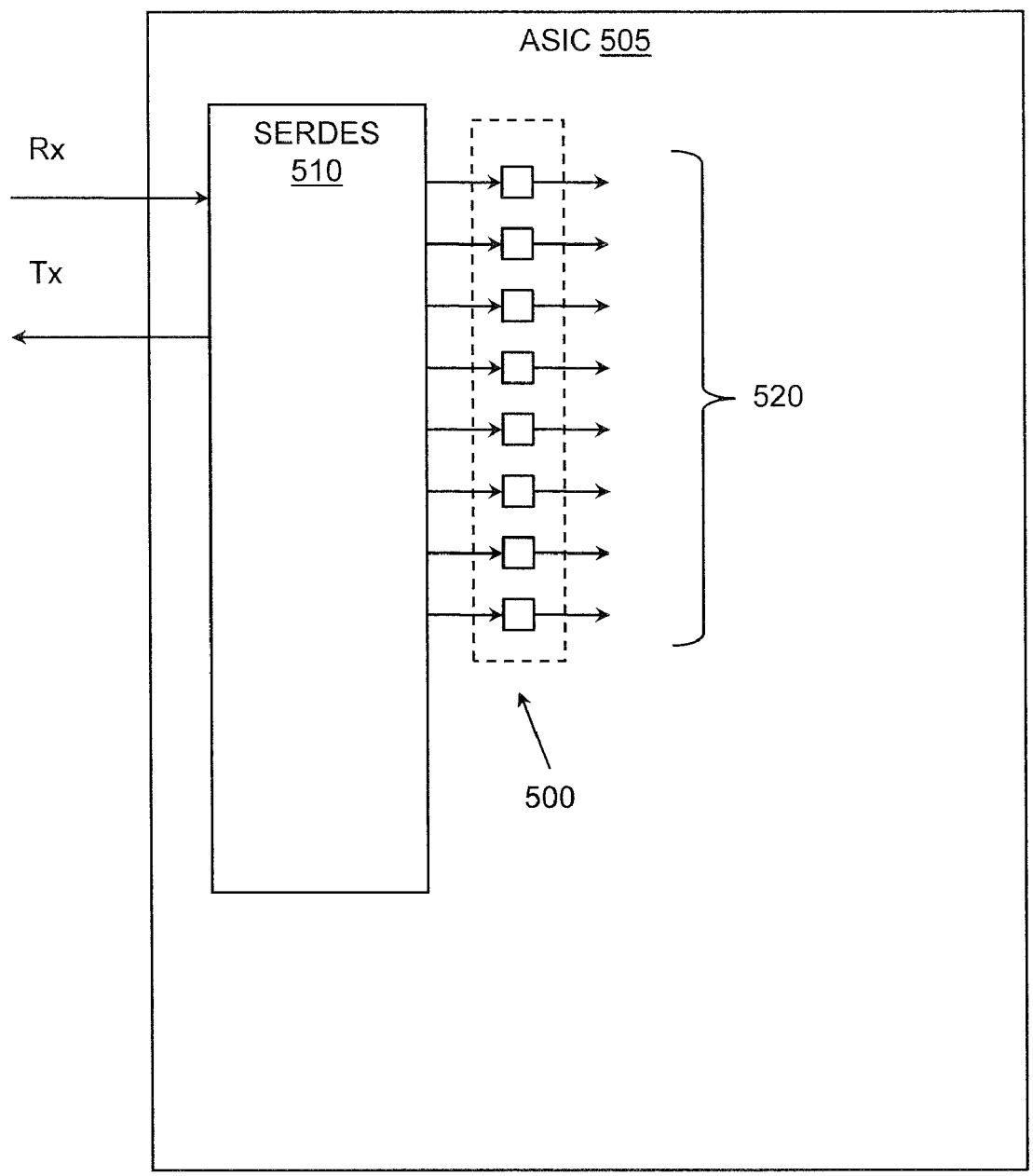
FIG. 5 illustrates an example embedded set of multiplexers (ESOMs) associated with programmable fault injection.

FIG. 5 illustrates an example set of multiplexers (SOMs) 500 associated with programmable fault injection. The SOMs 500 may be embedded in an ASIC 505. The SOMs 500 may be similar to the ESOMs 140 of FIG. 1 and/or the multiplexer 300 of FIG. 3. A SERDES 510 may, for example, output data to the set of multiplexers 500. The SERDES 510 may be similar to the SERDES 110 of FIG. 1, the SERDES 210 of FIG. 2, the SERDES 310 of FIG. 3, and/or the SERDES 400 of FIG. 4. The SOMs 500 may be controlled as a group or individually to inject data faults into a data stream exiting the SERDES 510. The SOMs 500 may be controlled, for example, by an embedded fault injection logic (EFIL) to inject data faults into the data stream. The data stream may flow into a logic in the ASIC 505 that includes a fault diagnosis system that detects and diagnoses data faults. Injection of data faults into the data stream may be used to test the fault diagnosis system of the logic in the ASIC 505 by injecting a fault into a single bit of data or into multiple bits of the data stream. The EFIL may control a single multiplexer in the SOM 500 to inject a data fault. However, the EFIL may control multiple multiplexers in the SOM 500 to inject data faults simultaneously and/or at different times.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

"Software", as used herein, includes but is not limited to, one or more executable instruction that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

Figure 6:
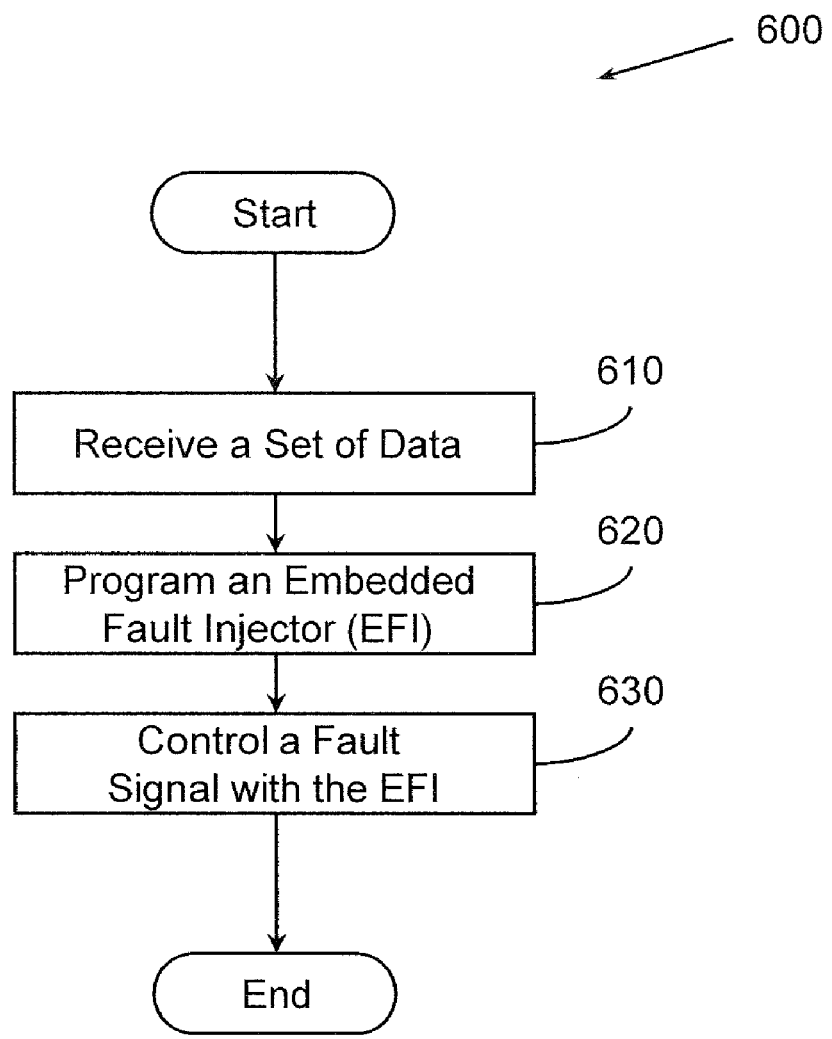
FIG. 6 illustrates an example method associated with programmable fault injection.

FIG. 6 illustrates a method 600 associated with programmable ASIC fault injection. Method 600 may include, at 610, receiving a set of data. The set of data may describe a fault type, a fault initiation time, a fault duration, and so on. The fault type may include a stuck at zero fault, a stuck at one fault, a flip data fault (e.g. invert data fault), and so on. The fault type may also include a normal data state that allows the data to flow uninterrupted without a change. The fault duration may be a time interval based on clock cycles of the ASIC. For example, the fault duration may be for three clock cycles. The fault initiation time may be used to initiate a fault signal. The fault signal may be a number of cycles after the ASIC is started for a run test. For example, the fault initiation time may be one thousand cycles after the start of the ASIC program that is to be tested.

Method 600 may also include, at 620, programming an embedded fault injector (EFI). The EFI may be in an ASIC and the EFI may be programmed based, at least in part, on the set of data. The set of data may be used to program the EFI to inject a type of fault, start a fault injection at an initiation time, continue injecting a fault for a fault duration, select a location within the ASIC to inject the fault, and so on.

Method 600 may also include, at 630, controlling a fault signal with the EFI. The fault signal may be based, at least in part, on the set of data. The fault signal may be injected to a data path in the ASIC. The EFI may control a multiplexer or set of multiplexers to inject faults into a data stream. For example, the EFI may control the SOMs 500 of FIG. 5 to inject faults into the data stream exiting SERDES 510 of FIG. 5. The data path may flow to a logic in the ASIC that includes a fault diagnosis system to detect and diagnose data faults. The fault signal may be intentionally introduced into the data path to test the fault diagnosis system in the ASIC.

In one embodiment, controlling the fault signal includes selecting multiple types of faults for different data paths. The multiple fault signals may be injected simultaneously to different data paths in the ASIC. In one embodiment, a two bit signal selects a fault state of the fault signal. The EFI controls the two bit signal and selects the fault state. A first fault state is a stuck at zero fault, a second fault state is a stuck at one fault, a third fault state is an invert data fault, and a fourth fault state is a normal data state. One skilled in the art will realize that other fault states of the fault signal may be selected and injected into the data path.

While FIG. 6 illustrates various actions occurring in serial, it is to be appreciated that various actions illustrated in FIG. 6 could occur substantially in parallel. By way of illustration, a first process could receive a set of data at 610, a second process could program an embedded fault injector (EFI) at 620, and a third process could control a fault signal with the EFI at 630. While three processes are described, it is to be appreciated that a greater and/or lesser number of processes could be employed and that lightweight processes, regular processes, threads, and other approaches could be employed.

In one example, executable instructions associated with performing a method may embodied as a logic encoded in one or more tangible media for execution. When executed, the instructions may perform a method. Thus, in one example, a logic encoded in one or more tangible media may store computer executable instructions that if executed by a machine (e.g., ASIC) cause the machine to perform method 600. While executable instructions associated with the above method are described as being embodied as a logic encoded in one or more tangible media, it is to be appreciated that executable instructions associated with other example methods described herein may also be stored on a tangible media.

A "tangible media", as used herein, refers to a medium that stores signals, instructions and/or data. A tangible media may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a tangible medium may include, but are not limited to, a floppy disk, a flexible disk, a hard disk, a magnetic tape, other magnetic medium, an application specific integrated circuit (ASIC), a compact disk CD, other optical medium, a random access memory (RAM), a read only memory (ROM), a memory chip or card, a memory stick, and other media from which a computer, a processor or other electronic device can read.

Figure 7:
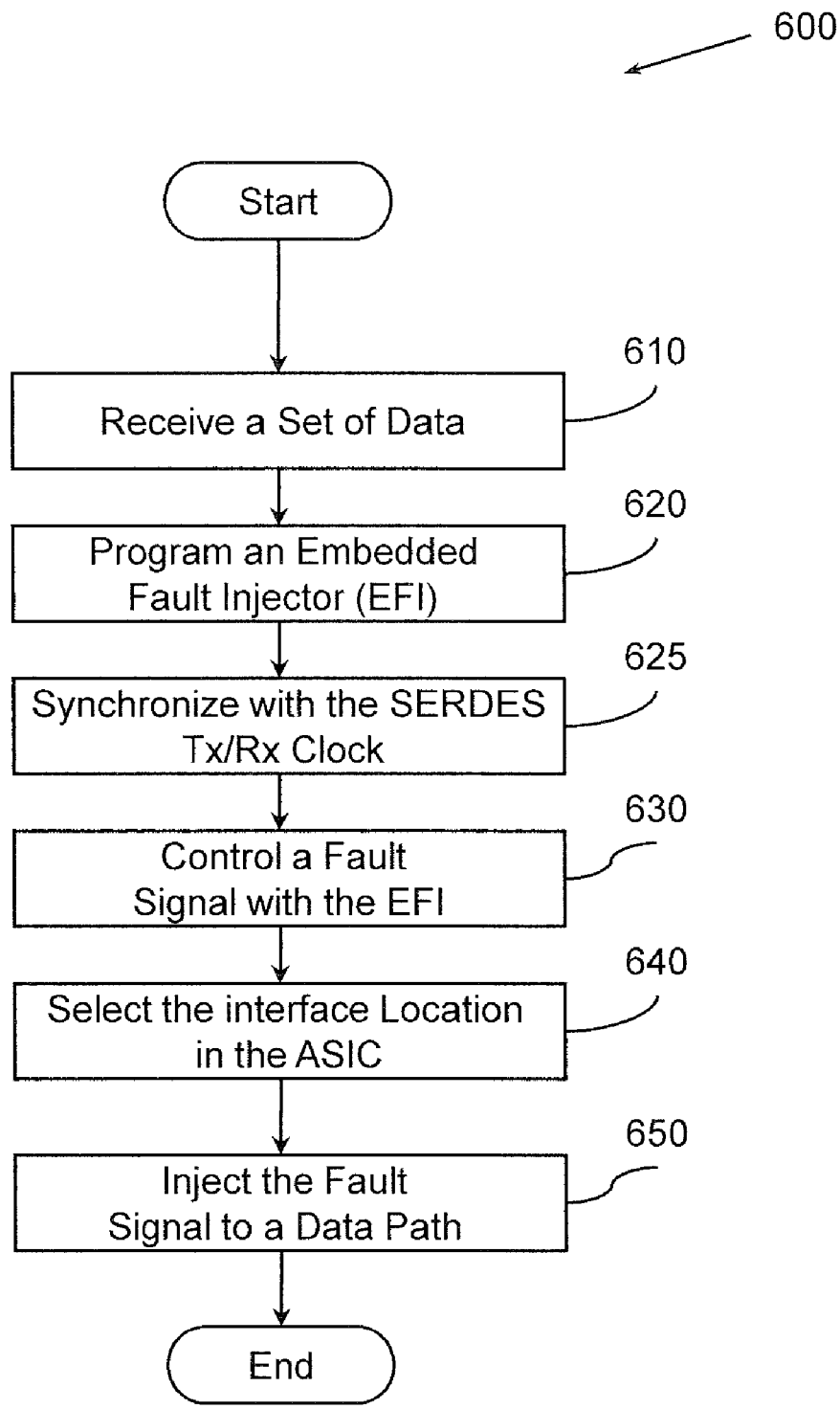
FIG. 7 illustrates another example method associated with programmable fault injection.

FIG. 7 illustrates another embodiment of method 600. This embodiment of method 600 also includes, at 625, synchronizing with a SERDES TxClk and/or RxClk clocks. Synchronizing with the SERDES clock at 625 may include synchronizing timing associated with the fault signal, the fault initiation time, the fault duration, and so on.

Method 600 may also include, at 640, selecting a location in the ASIC. The location may be a location to inject a fault signal. Multiple data paths in the ASIC may be configured to accept fault signals. These multiple data paths may be, for example, the data paths leading to and/or exiting SERDES 110 of FIG. 1. One skilled in the art will realize that more than two locations may be selected from and/or used to inject fault signals.

Method 600 may also include, at 650, injecting the fault signal. The fault signal may be injected, for example, into a data path, into a control path, at an ASIC boundary, and so on. As described above, in one embodiment the type of fault can be selected as can the start time and duration of the fault. This facilitates exercising processes on the ASIC. This also facilitates performing system software diagnosis.

Figure 8:
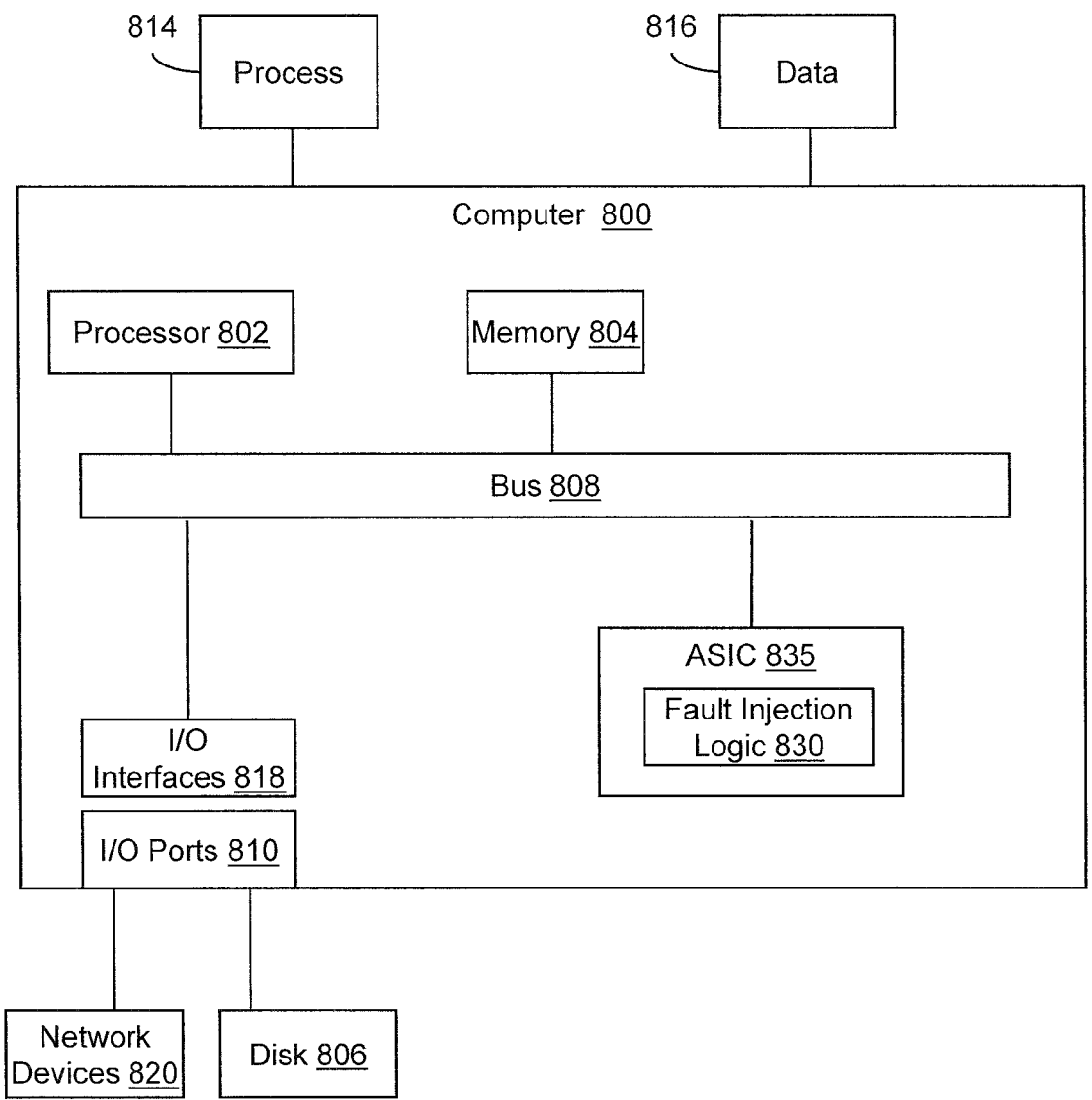
FIG. 8 illustrates an example computing environment in which example systems and methods, and equivalents, may operate.

FIG. 8 illustrates an example computing device in which example systems and methods described herein, and equivalents, may operate. The example computing device may be a computer 800 that includes a processor 802, a memory 804, and input/output ports 810 operably connected by a bus 808. In one example, the computer 800 may include a fault injection logic 830 to facilitate injecting data faults in an application specific integrated circuit (ASIC) 835. The fault injection logic 830 may be located in the ASIC 835. In different examples, the logic 830 may be implemented in hardware, software, firmware, and/or combinations thereof. While the logic 830 is illustrated as a hardware component attached to the bus 808, it is to be appreciated that in one example, the logic 830 could be implemented in the processor 802.

Thus, logic 830 may provide means (e.g., hardware, firmware) for receiving a set of data describing a fault type, a fault initiation time, and a fault duration. The means may be implemented, for example, as an ASIC 835 programmed to include a fault injection logic 830 that injects data faults into a data path.

Logic 830 may also provide means (e.g., hardware, firmware) for programming an embedded fault injector logic (EFIL) in an ASIC 835 based, at least in part, on the set of data. Logic 830 may also provide means (e.g., hardware, firmware) for controlling an embedded set of multiplexers (ESOMs) that are controllable to inject a fault signal to a data path associated with logics in an ASIC. The ESOMs may be controlled, at least in part, by the EFIL.

Generally describing an example configuration of the computer 800, the processor 802 may be a variety of various processors including dual microprocessor and other multi-processor architectures. A memory 804 may include volatile memory and/or non-volatile memory. Non-volatile memory may include, for example, ROM, programmable ROM (PROM), and so on. Volatile memory may include, for example, RAM, static RAM (SRAM), dynamic RAM (DRAM), and so on. While a computer 800 is described, ASIC 835 may appear in a networking device (e.g. networking switch).

A disk 806 may be operably connected to the computer 800 via, for example, an input/output interface (e.g., card, device) 818 and an input/output port 810. The disk 806 may be, for example, a magnetic disk drive, a solid state disk drive, a floppy disk drive, a tape drive, a Zip drive, a flash memory card, a memory stick, and so on. Furthermore, the disk 806 may be a CD-ROM drive, a CD recordable (CD-R) drive, a CD rewriteable (CD-RW) drive, a digital versatile disk and/or digital video disk ROM (DVD ROM), and so on. The memory 804 can store a process 814 and/or a data 816, for example. The disk 806 and/or the memory 804 can store an operating system that controls and allocates resources of the computer 800.

The bus 808 may be a single internal bus interconnect architecture and/or other bus or mesh architectures. While a single bus is illustrated, it is to be appreciated that the computer 800 may communicate with various devices, logics, and peripherals using other busses (e.g., peripheral component interconnect express (PCIE), 1394, universal serial bus (USB), Ethernet). The bus 808 can be types including, for example, a memory bus, a memory controller, a peripheral bus, an external bus, a crossbar switch, and/or a local bus.

The computer 800 may interact with input/output devices via the i/o interfaces 818 and the input/output ports 810. Input/output devices may be, for example, a keyboard, a microphone, a pointing and selection device, cameras, video cards, displays, the disk 806, the network devices 820, and so on. The input/output ports 810 may include, for example, serial ports, parallel ports, and USB ports.

The computer 800 can operate in a network environment and thus may be connected to the network devices 820 via the i/o interfaces 818, and/or the i/o ports 810. Through the network devices 820, the computer 800 may interact with a network. Through the network, the computer 800 may be logically connected to remote computers. Networks with which the computer 800 may interact include, but are not limited to, a LAN, a WAN, and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. An application specific integrated circuit (ASIC), comprising:
   one or more logics to process data in the ASIC;
   a serializer de-serializer (SERDES) within the ASIC and communicatively coupled to at least one of the logics by a path configured to carry data between the SERDES and the at least one of the logics;
   an embedded fault injection logic (EFIL) to control injection of a fault signal to the path; and
   an embedded set of multiplexers (ESOMs) that are configured to be controlled by the EFIL and that are configured to inject the fault signal to the path.

2. The ASIC of claim 1, where the fault signal is one of, a stuck at zero signal, a stuck at one signal, an inverted signal, and a normal signal, and where the EFIL is configured to control the ESOMs using a two bit signal to select the fault signal type.

3. The ASIC of claim 2, where the EFIL comprises a programmable slave register, and where the programmable slave register controls the fault signal type.

4. The ASIC of claim 1, where the EFIL comprises a fault injection timer to control when the fault signal is to be injected.

5. The ASIC of claim 4, where the fault injection timer is configured to control when injection of the fault signal is to begin.

6. The ASIC of claim 1, where the fault signal is configured to exercise a portion of a process performed by the ASIC.

7. The ASIC of claim 6, where the process is one of, an error detection process, an error handling process, and an error correction process.

8. The ASIC of claim 4, where the fault injection timer is configured to control for how long the fault signal is to be injected.

9. The ASIC of claim 1, where the EFIL is configured to control the ESOMS to inject two or more fault signals at two or more locations in the ASIC.

10. The ASIC of claim 9, where the EFIL is configured to control the ESOMs to inject two or more fault signals at two or more locations in the ASIC at the same time.

11. A logic encoded in one or more tangible media for execution and when executed operable to perform a method, the method comprising:
    receiving a set of data describing a fault type, a fault initiation time, and a fault duration;
    programming an embedded fault injector (EFI) in an ASIC based at least in part on the set of data; and
    controlling a fault signal with the EFI, where the fault signal is based, at least in part, on the set of data, and where the fault signal is injected into a path in the ASIC, where the path is configured to carry data between one or more logics that process data in the ASIC and a serializer de-serializer (SERDES) within the ASIC.

12. The logic of claim 11, the method comprising:
    selecting a location in the ASIC to inject a fault signal, where multiple data paths in the ASIC are configured to accept fault signals.

13. The logic of claim 11, the method comprising:
    configuring the fault type, the fault initiation time, and the fault duration to exercise a system software in the ASIC.

14. The logic of claim 13, where the system software is configured to perform one or more of, error detection, error handling, and error correction.

15. The logic of claim 11, the method comprising:
    synchronizing one or more of, the fault signal, the fault initiation time, and the fault duration, with an ASIC synchronization clock.

16. The logic of claim 11, where programming the EFI comprises controlling a type of fault to be injected, a location where the fault is to be injected, a start time for the fault to be injected, and a duration for the fault to be injected.

17. The logic of claim 1, where the type of fault to be injected, the location where the fault is to be injected, the start time for the fault to be injected, and the duration for the fault to be injected are associated with triggering an exception handler in a process running in the ASIC.

18. The logic of claim 16, where the type of fault to be injected, the location where the fault is to be injected, the start time for the fault to be injected, and the duration for the fault to be injected are associated with exercising a portion of a diagnostic process running in the ASIC.

19. A system, comprising:
    means for receiving a set of data describing a fault type, a fault initiation time, and a fault duration;
    means for programming an embedded fault injector logic (EFIL) in an application specific integrated circuit (ASIC) based, at least in part, on the set of data; and
    means for controlling an embedded set of multiplexers (ESOMs) that are controllable to inject a fault signal to a data path configured to carry data between one or more logics in an ASIC and a serializer de-serializer (SERDES) within the ASIC, where the ESOMs are controlled, at least in part, by the EFIL.

20. The ASIC of claim 1, where at least one of the ESOMs is located on the path and is configured to switch between injecting the fault signal and allowing at least one of data sent by the SERDES to the one or more logics and data sent by the one or more logics to the SERDES to be transmitted on the path.

* * * * *

UNITED STATES PATENT AND TRADEMARK OFFICE
CERTIFICATE OF CORRECTION

| | | |
|---|---|---|
| PATENT NO. | : 8,051,346 B2 | Page 1 of 1 |
| APPLICATION NO. | : 12/392468 | |
| DATED | : November 1, 2011 | |
| INVENTOR(S) | : Somasundaram et al. | |

It is certified that error appears in the above-identified patent and that said Letters Patent is hereby corrected as shown below:

Column 12, Claim 17, Line 22, please delete "1" and insert -- 16 -- therefor.

Signed and Sealed this
Twenty-second Day of May, 2012

David J. Kappos
*Director of the United States Patent and Trademark Office*